(12) United States Patent
Wang et al.

(10) Patent No.: US 9,825,254 B2
(45) Date of Patent: Nov. 21, 2017

(54) NANOWIRE STRUCTURE OVER AN ENCAPSULATION FOR AN ORGANIC LIGHT-EMITTING DIODE DEVICE

(71) Applicant: BOE TECHNOLOGY GROUP CO., LTD., Beijing (CN)

(72) Inventors: Youwei Wang, Beijing (CN); Peng Cai, Beijing (CN); Zhihui Xiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/151,953

(22) Filed: May 11, 2016

(65) Prior Publication Data

US 2017/0084869 A1    Mar. 23, 2017

(30) Foreign Application Priority Data

Sep. 18, 2015    (CN) .......................... 2015 1 0601439

(51) Int. Cl.
| | |
|---|---|
| *H01L 29/08* | (2006.01) |
| *H01L 21/00* | (2006.01) |
| *H01L 51/52* | (2006.01) |
| *H01L 51/56* | (2006.01) |
| *H01L 27/32* | (2006.01) |
| *H01L 33/52* | (2010.01) |

(52) U.S. Cl.
CPC .......... *H01L 51/5256* (2013.01); *H01L 27/32* (2013.01); *H01L 51/5237* (2013.01); *H01L 51/5262* (2013.01); *H01L 51/56* (2013.01); *H01L 33/52* (2013.01); *H01L 2251/301* (2013.01); *H01L 2251/303* (2013.01); *H01L 2251/308* (2013.01); *H01L 2251/5338* (2013.01); *H01L 2251/5369* (2013.01); *H01L 2251/558* (2013.01)

(58) Field of Classification Search
CPC . H01L 51/5256; H01L 51/56; H01L 51/5237; H01L 27/32; H01L 51/5262; H01L 33/52
See application file for complete search history.

(56) References Cited

U.S. PATENT DOCUMENTS

| | | | | |
|---|---|---|---|---|
| 8,866,383 | B2* | 10/2014 | Jang ...................... | H05B 33/04 |
| | | | | 313/512 |
| 9,048,455 | B2* | 6/2015 | Lee ...................... | H01L 51/5281 |
| 9,614,189 | B2* | 4/2017 | He ...................... | H01L 51/5281 |
| 2003/0117066 | A1* | 6/2003 | Silvernail ........... | H01L 51/5237 |
| | | | | 313/504 |
| 2012/0242222 | A1* | 9/2012 | Jung ................... | H01L 51/5253 |
| | | | | 313/512 |

(Continued)

*Primary Examiner* — Alonzo Chambliss
(74) *Attorney, Agent, or Firm* — Harness, Dickey & Pierce, P.L.C.

(57) ABSTRACT

The present disclosure provides an encapsulation structure, a method for encapsulating an OLED device, and a flexible display device. The encapsulation structure includes: a flexible substrate; an OLED device arranged on the flexible substrate; a thin film encapsulation layer covering the OLED device and including a plurality of first inorganic films and a plurality of organic polymer films arranged alternately; and a second inorganic film having a nanowire structure and covering the thin film encapsulation layer.

16 Claims, 1 Drawing Sheet

(56) References Cited

U.S. PATENT DOCUMENTS

| | | | | |
|---|---|---|---|---|
| 2013/0126932 A1* | 5/2013 | Chen | ............... | H01L 51/5256 257/99 |
| 2014/0077187 A1* | 3/2014 | Lee | ............... | H01L 51/5281 257/40 |
| 2014/0084277 A1* | 3/2014 | Nakamura | ......... | H01L 51/5209 257/40 |
| 2014/0183462 A1* | 7/2014 | Lee | ............... | H01L 51/5262 257/40 |

* cited by examiner

NANOWIRE STRUCTURE OVER AN ENCAPSULATION FOR AN ORGANIC LIGHT-EMITTING DIODE DEVICE

CROSS-REFERENCE TO RELATED APPLICATION

The present application claims a priority of the Chinese Patent Application No. 201510601439.4 filed on Sep. 18, 2015, which is incorporated herein by reference in its entirety.

TECHNICAL FIELD

The present disclosure relates to the field of display technology, in particular to an encapsulation structure, a method for encapsulating an organic light-emitting diode (OLED) device, and a flexible display device.

BACKGROUND

As a novel display element, an OLED device has image quality comparable with a thin film transistor-liquid crystal display (TFT-LCD), but its production cost is far less than that of the TFT-LCD. The OLED device has become a research hotspot in the past 20 years due to its advantages in flat-panel display such as high brightness, rich colors, being driven by a low-voltage direct current, and a simple manufacture process, and now it has entered mass production.

Generally, the OLED device includes a rigid glass substrate or a flexible polymer substrate, a transparent anode and a metallic cathode deposited on the substrate, and two or more organic light-emitting layers arranged between the transparent anode and the metallic cathode. The organic light-emitting layers usually include a hole injection layer, a hole transport layer, a light-emitting layer, an electron transport layer and an electron injection layer. The OLED device is very sensitive to oxygen and moisture, and in the case that oxygen and moisture enter the OLED device, such defects as dark spots and pinholes may occur. In addition, electrodes in the OLED device may be oxidized, and an organic material of the OLED display device may react with oxygen and moisture. As a result, a service life of the OLED device may be adversely affected. Hence, an encapsulation technology is one of the keys to achieve the mass production of the OLED device.

SUMMARY

An object of the present disclosure is to provide an encapsulation structure, a method for encapsulating an OLED device, and a flexible display device, so as to improve the moisture resistance of the encapsulation structure, thereby to prolong a service life of a flexible OLED device.

In one aspect, the present disclosure provides in some embodiments an encapsulation structure, including: a flexible substrate; an OLED device arranged on the flexible substrate; a thin film encapsulation layer covering the OLED device, and including a plurality of first inorganic films and a plurality of organic polymer films arranged alternately; and a second inorganic film having a nanowire structure and covering the thin film encapsulation layer.

Alternatively, the second inorganic film has a thickness of 100 to 200 nm, and a nanowire of the second inorganic film has a diameter of 50 to 200 nm.

Alternatively, the encapsulation structure further includes a barrier layer covering the second inorganic film.

Alternatively, the second inorganic film is made of a material selected from the group consisting of $Al_2O_3$, $TiO_2$, ZnO, $ZrO_2$, MgO, $HfO_2$, $Ta_2O_5$, $Si_3N_4$, AlN, SiNx, SiON, SiO, $SiO_2$, SiOx, SiC and ITO.

In another aspect, the present disclosure provides in some embodiments a flexible display device including the above-mentioned encapsulation structure.

In yet another aspect, the present disclosure provides in some embodiments a method for encapsulating an OLED device, including steps of: providing a first hard substrate, and forming a flexible substrate on the first hard substrate; forming the OLED device on the flexible substrate; forming a thin film encapsulation layer covering the OLED device and consisting of a plurality of first inorganic films and a plurality of organic films arranged alternately; and forming a second inorganic film covering the thin film encapsulation layer and having a nanowire structure.

Alternatively, the step of forming the second inorganic film covering the thin film encapsulation layer and having the nanowire structure includes depositing an inorganic layer onto the thin film encapsulation layer with a metal mask having a nanopore structure, so as to form the second inorganic film.

Alternatively, the metal mask having the nanopore structure includes a plurality of nanopores, a distance between the adjacent nanopores is 20 to 30 nm, an inner diameter of each nanopore is 50 to 200 nm, and each nanopore has a length of 100 to 200 nm.

Alternatively, the second inorganic film is made of SiNx.

Alternatively, the metal mask having the nanopore structure is in direct contact with the thin film encapsulation layer, or separated from the thin film encapsulation layer at an interval.

Alternatively, the step of forming the second inorganic film covering the thin film encapsulation layer and having the nanowire structure includes depositing an inorganic material having a self-assembly growth characteristic onto the thin film encapsulation layer by chemical vapor deposition, so as to form the second inorganic film.

Alternatively, the inorganic material having the self-assembly growth characteristic is ZnO.

Alternatively, the method further includes: providing a second hard substrate and forming a thermal-failure adhesive layer on the second hard substrate; and forming a barrier layer on the thermal-failure adhesive layer. Subsequent to the step of forming the second inorganic film covering the thin film encapsulation layer and having the nanowire, the method further includes aligning the first hard substrate with the second inorganic film to the second hard substrate with the barrier layer, and heating the thermal-failure adhesive layer to remove the second hard substrate.

According to the embodiments of the present disclosure, the inorganic film having the nanowire structure is formed on the thin film encapsulation layer covered with the OLED device. Due to the characteristics of the nanowire structure, it is very difficult for the moisture to pass therethrough, i.e., the inorganic film having the nanowire structure is hydrophobic, so as to effectively improve the moisture resistance of the encapsulation structure. As a result, in the case that the inorganic film having the nanowire structure is used for encapsulating the OLED device, it is able to prolong a service life of the OLED device, and improve the reliability of the OLED device during the preservation and use thereof.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
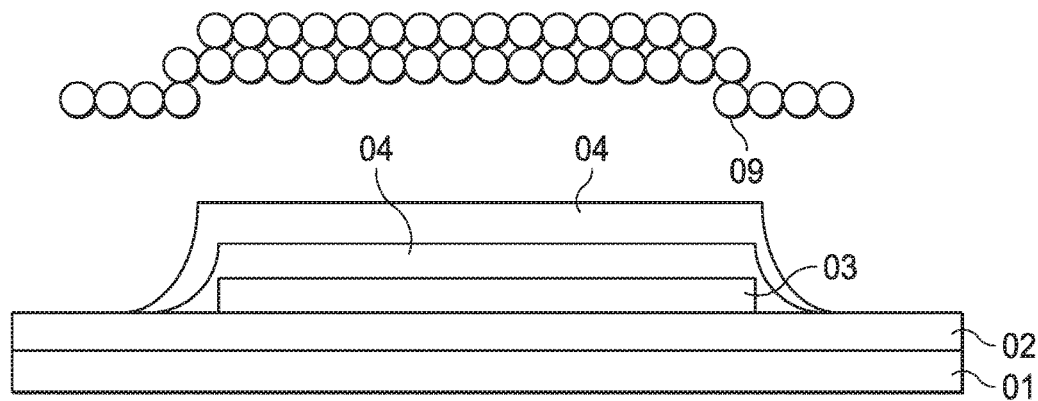
FIG. 1 is a schematic view showing an encapsulation structure.

Generally, a conventional flexible OLED device is encapsulated by a thin film encapsulation method. To be specific, a plurality of organic films and a plurality of inorganic films are manufactured by a vacuum plating process and arranged alternately so as to form a thin film encapsulation layer. The inorganic film is relatively dense, and mainly functions as a moisture-oxygen barrier layer. The inorganic film is less elastic and has a large internal stress, and in the case that an external force is applied thereto, cracks may easily occur or it may be easily separated from the OLED device. At this time, it is necessary to provide an organic film as a buffer layer, because the organic film may effectively prevent the occurrence of the cracks for the inorganic film due to its large elasticity. However, during the vacuum plating process with a mask plate, a mask shadow may usually occur. As shown in FIG. 1, a thickness of the thin film encapsulation layer at a periphery may be far less than that of the thin film encapsulation layer at the other region, so moisture 09 may easily enter an encapsulation structure from the periphery of the thin film encapsulation layer. In addition, a surface of the thin film encapsulation layer is not dense enough to prevent the moisture from being adsorbed onto the surface of the thin film encapsulation layer. Hence, the moisture may enter the encapsulation structure more quickly due to a concentration gradient at a local region, and a service life of the OLED device may be reduced. In FIG. 1, 01 represents a hard substrate, 02 represents a flexible substrate, 03 represents the OLED device, and 04 represents the inorganic films and the organic films arranged alternately.

The present disclosure provides in some embodiments an encapsulation structure, a method for encapsulating an OLED device, and a flexible display device, so as to improve the moisture and oxygen resistance of the encapsulation structure, thereby to prolong a service life of the OLED device.

The present disclosure provides in some embodiments an encapsulation structure, which includes a flexible substrate, an OLED device arranged on the flexible substrate, a thin film encapsulation layer covering the OLED device and including a plurality of first inorganic films and a plurality of organic polymer films arranged alternately, and a second inorganic film having a nanowire structure and covering the thin film encapsulation layer.

According to the embodiments of the present disclosure, the inorganic film having the nanowire structure is formed on the thin film encapsulation layer covered with the OLED device. Due to the characteristics of the nanowire structure, it is very difficult for the moisture to pass therethrough, i.e., the inorganic film having the nanowire structure is hydrophobic, so as to effectively improve the moisture resistance of the encapsulation structure. As a result, in the case that the inorganic film having the nanowire structure is used for encapsulating the OLED device, it is able to prolong a service life of the OLED device, and improve the reliability of the OLED device during the preservation and use thereof.

Alternatively, the second inorganic film has a thickness of 100 to 200 nm, and a nanowire of the second inorganic film has a diameter of 50 to 200 nm, so as to prevent the entrance of moisture in an effective manner.

Alternatively, the encapsulation structure further includes a barrier layer covering the second inorganic film, so as to further improve the moisture resistance of the encapsulation structure.

Alternatively, the second inorganic film is made of a material selected from the group consisting of $Al_2O_3$, $TiO_2$, ZnO, $ZrO_2$, MgO, $HfO_2$, $Ta_2O_5$, $Si_3N_4$, AlN, SiNx, SiON, SiO, $SiO_2$, $SiO_x$, SiC and ITO.

The present disclosure further provides in some embodiments a flexible display device, which includes the above-mentioned encapsulation structure. The encapsulation structure has been described hereinbefore, and thus will not be repeated herein. In addition, any other components of the flexible display device are known in the art, and thus will not be particularly defined herein. The flexible display device may be any product or member having a display function, such as an electronic paper, a television, a display, a digital photo frame, a mobile phone or a flat-panel computer.

According to the embodiments of the present disclosure, the inorganic film having the nanowire structure is formed on the thin film encapsulation layer covered with the OLED device. Due to the characteristics of the nanowire structure, it is very difficult for the moisture to pass therethrough, i.e., the inorganic film having the nanowire structure is hydrophobic, so as to effectively improve the moisture resistance of the encapsulation structure. As a result, in the case that the inorganic film having the nanowire structure is used for encapsulating the OLED device, it is able to prolong a service life of the OLED device, and improve the reliability of the OLED device during the preservation and use thereof.

The present disclosure further provides in some embodiments a method for encapsulating an OLED device, which includes steps of: providing a first hard substrate, and forming a flexible substrate on the first hard substrate; forming the OLED device on the flexible substrate; forming a thin film encapsulation layer covering the OLED device and consisting of a plurality of first inorganic films and a plurality of organic films arranged alternately; and forming a second inorganic film covering the thin film encapsulation layer and having a nanowire structure.

According to the embodiments of the present disclosure, the inorganic film having the nanowire structure is formed on the thin film encapsulation layer covered with the OLED device. Due to the characteristics of the nanowire structure, it is very difficult for the moisture to pass therethrough, i.e., the inorganic film having the nanowire structure is hydrophobic, so as to effectively improve the moisture resistance of the encapsulation structure. As a result, in the case that the inorganic film having the nanowire structure is used for encapsulating the OLED device, it is able to prolong a service life of the OLED device, and improve the reliability of the OLED device during the preservation and use thereof.

Alternatively, the step of forming the second inorganic film covering the thin film encapsulation layer and having the nanowire structure includes depositing an inorganic layer onto the thin film encapsulation layer with a metal mask having a nanopore structure, so as to form the second inorganic film.

Alternatively, the metal mask having the nanopore structure includes a plurality of nanopores, a distance between the adjacent nanopores is 20 to 30 nm, an inner diameter of each nanopore is 50 to 200 nm, and each nanopore has a length of 100 to 200 nm. Through this metal mask, it is able to form the second inorganic film with a thickness of 100 to 200 nm. In addition, because the nanowire of the second inorganic film has a diameter of 50 to 200 nm, it is able to prevent the entrance of the moisture in an effective manner.

Alternatively, the step of forming the second inorganic film covering the thin film encapsulation layer and having the nanowire structure further includes depositing an inorganic material having a self-assembly growth characteristic onto the thin film encapsulation layer by chemical vapor deposition, so as to form the second inorganic film. To be specific, the inorganic material having the self-assembly growth characteristic may be ZnO, so as to facilitate the formation of the nanowire structure.

Alternatively, the method further includes providing a second hard substrate and forming a thermal-failure adhesive layer on the second hard substrate, and forming a barrier layer on the thermal-failure adhesive layer. Subsequent to the step of forming the second inorganic film covering the thin film encapsulation layer and having the nanowire structure, the method further includes aligning the first hard substrate with the second inorganic film to the second hard substrate with the barrier layer, and heating the thermal-failure adhesive layer to remove the second hard substrate.

The barrier layer covering the second inorganic film may be formed through the above-mentioned steps, so as to further improve the moisture and oxygen resistance of the encapsulation structure.

The present disclosure will be described hereinafter in conjunction with the drawings and embodiments. During the vacuum plating process with a mask plate, a mask shadow may usually occur. As shown in FIG. 1, a thickness of the thin film encapsulation layer at a periphery may be far less than that of the thin film encapsulation layer at the other region, so moisture 09 may easily enter an encapsulation structure from the periphery of the thin film encapsulation layer. In addition, a surface of the thin film encapsulation layer is not dense enough to prevent the moisture from being adsorbed onto the surface of the thin film encapsulation layer. Hence, the moisture may enter the encapsulation structure more quickly due to a concentration gradient at a local region, and a service life of the OLED device may be reduced.

In order to overcome the above drawbacks, the present disclosure provides in some embodiments a method for encapsulating an OLED device, which includes the followings Steps 1 to 9.

Step 1: providing a first hard substrate 1. To be specific, the first hard substrate 1 may be a quartz or glass substrate.

Step 2: forming a flexible substrate 2 on the first hard substrate 1. To be specific, the flexible substrate 2 may be made of polyimide and formed on the first hard substrate 1.

Step 3: forming an OLED device 3 on the flexible substrate 2.

Step 4: forming a thin film encapsulation layer 4 covering the OLED 3. To be specific, the thin film encapsulation layer 4 consists of a plurality of first inorganic films and a plurality of organic films arranged alternately, and the outermost film of the thin film encapsulation layer is the organic film. The first inorganic film may be made of SiNx, and the organic film may be made of siloxane.

Step 5: depositing an inorganic material onto the thin film encapsulation layer 4 with a metal mask 10 having a nanopore structure, so as to form a second inorganic film 5 having a nanowire structure.

Figure 2:
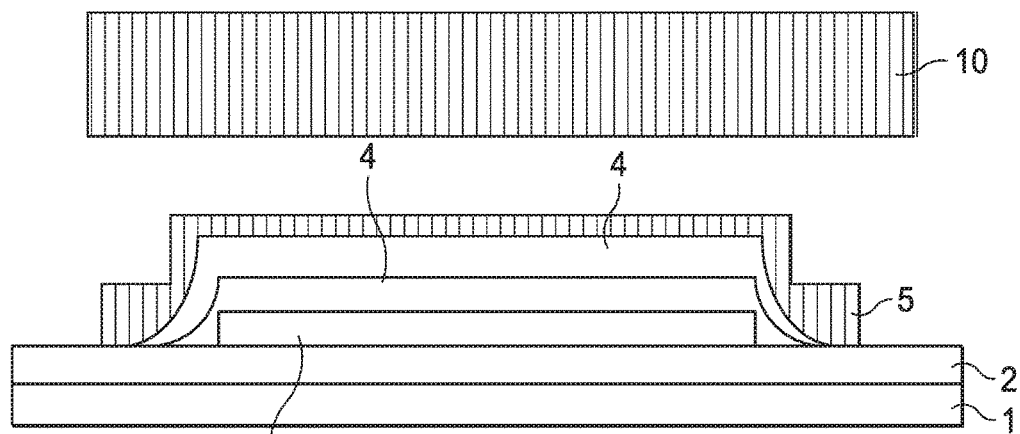
FIG. 2 is a schematic view showing a encapsulation structure with a thin film encapsulation layer according to one embodiment of the present disclosure.

As shown in FIG. 2, the metal mask 10 having the nanowire structure may be in direct contact with the thin film encapsulation layer or separated from the thin film encapsulation layer at an interval. The metal mask having the nanopore structure includes a plurality of nanopores, a distance between the adjacent nanopores is 20 to 30 nm, an inner diameter of each nanopore is 50 to 200 nm, and each nanopore has a length of 100 to 200 nm. To be specific, SiNx may be deposited onto the thin film encapsulation layer through the metal mask 10 in FIG. 2, so as to form the SiNx film having a thickness of 100 to 200 nm and having the nanowire with a diameter of 50 to 200 nm.

Air may be effectively entrapped at a top surface of the SiNx film having the nanowire structure. Due to the capillary action, it is impossible for water drops to fill up a gap. At this time, an adhesive force between the water drop and the nanostructure is far less than a surface tension of the water drop, so it is difficult for the water drop to be absorbed at a top surface of the nanostructure. As a result, it is able to improve a water environment at a surface of the encapsulation structure, prevent the entrance of the moisture, thereby to improve the water resistance of the encapsulation structure. In addition, the nanowire structure may also function as to alleviate a stress, so as to improve the flexibility of the flexible display device.

Step 6: providing a second hard substrate 8 and forming a thermal-failure adhesive layer 7 on the second hard substrate 8.

Step 7: forming a barrier layer 6 on the thermal-failure adhesive layer 7. To be specific, the barrier layer 6 may be made of an inorganic material.

Figure 3:
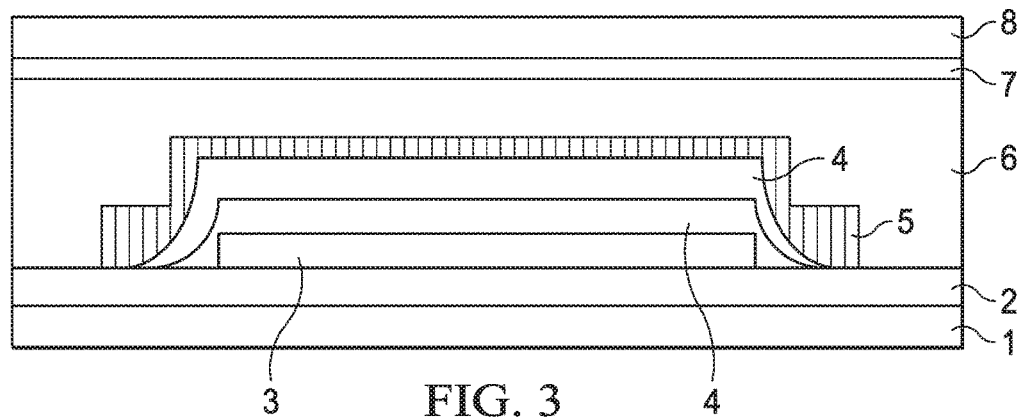
FIG. 3 is another schematic view showing the encapsulation structure with an OLED device according to one embodiment of the present disclosure.

Step 8: as shown in FIG. 3, aligning the first hard substrate 1 obtained after Step 5 to the second hard substrate 8 with the barrier layer 6.

Step 9: heating the thermal-failure adhesive layer 7, and removing the second hard substrate 8, so as to form the barrier layer 6 covering the second inorganic film 5.

The encapsulation structure in the embodiments of the present disclosure may be obtained through the above Steps 1 to 9. According to the embodiments of the present disclosure, the inorganic film having the nanowire structure is formed on the thin film encapsulation layer covered with the OLED device. Due to the characteristics of the nanowire structure, it is very difficult for the moisture to pass therethrough, i.e., the inorganic film having the nanowire structure is hydrophobic, so as to effectively improve the moisture resistance of the encapsulation structure. As a result, in the case that the inorganic film having the nanowire structure is used for encapsulating the OLED device, it is able to prolong a service life of the OLED device, and improve the reliability of the OLED device during the preservation and use thereof.

During the vacuum plating process with a mask plate, a mask shadow may usually occur. As shown in FIG. 1, a thickness of the thin film encapsulation layer at a periphery may be far less than that of the thin film encapsulation layer at the other region, so moisture 09 may easily enter an encapsulation structure from the periphery of the thin film encapsulation layer. In addition, a surface of the thin film encapsulation layer is not dense enough to prevent the moisture from being adsorbed onto the surface of the thin film encapsulation layer. Hence, the moisture may enter the encapsulation structure more quickly due to a concentration gradient at a local region, and a service life of the OLED device may be reduced.

In order to overcome the above drawbacks, the present disclosure provides in some embodiments a method for encapsulating an OLED device, which includes the following Steps 1 to 9.

Step 1: providing a first hard substrate 1. To be specific, the first hard substrate 1 may be a quartz or glass substrate.

Step 2: forming a flexible substrate 2 on the first hard substrate 1. To be specific, the flexible substrate 2 may be made of polyimide and formed on the first hard substrate 1.

Step 3: forming the OLED device 3 on the flexible substrate 2.

Step 4: forming a thin film encapsulation layer 4 covering the OLED 3. To be specific, the thin film encapsulation layer 4 consists of a plurality of first inorganic films and a plurality of organic films arranged alternately, and the outermost film of the thin film encapsulation layer is the organic film. The first inorganic film may be made of SiNx, and the organic film may be made of siloxane.

Step 5: depositing an inorganic material having a self-assembly growth characteristic onto the thin film encapsulation layer 4 by chemical vapor deposition, so as to form a second inorganic film 5 having a nanowire structure. To be specific, the inorganic material may be ZnO, which has a self-assembly growth characteristic and may easily form the nanowire structure. A ZnO film having a thickness of 100 to 200 nm and having a nanowire with a diameter of 50 to 200 nm may be formed. Of course, the second inorganic film may also be made of another inorganic material having the self-assembly growth characteristic. Due to the second inorganic film, it is able to reduce the influence of the mask shadow. The second inorganic film also exists at a mask shadow region. Although the nanowire structure at the mask shadow is of a smaller length, the moisture still needs to pass through the nanowire structure layer by layer. Air may be effectively entrapped at a top surface of the ZnO film having the nanowire structure. Due to the capillary action, it is impossible for water drops to fill up a gap. At this time, an adhesive force between the water drop and the nanostructure is far less than a surface tension of the water drop, so it is difficult for the water drop to be absorbed at a top surface of the nanostructure. As a result, it is able to improve a water environment at a surface of the encapsulation structure, prevent the entrance of the moisture, thereby to improve the water resistance of the encapsulation structure. In addition, the nanowire structure may also function as to alleviate a stress, so as to improve the flexibility of the flexible display device.

Step 6: providing a second hard substrate 8 and forming a thermal-failure adhesive layer 7 on the second hard substrate 8.

Step 7: forming a barrier layer 6 on the thermal-failure adhesive layer 7. To be specific, the barrier layer 6 may be made of an inorganic material.

Step 8: as shown in FIG. 3, aligning the first hard substrate 1 obtained after Step 5 to the second hard substrate 8 with the barrier layer 6.

Step 9: heating the thermal-failure adhesive layer 7, and removing the second hard substrate 8, so as to form the barrier layer 6 covering the second inorganic film 5.

The encapsulation structure in the embodiments of the present disclosure may be obtained through the above Steps 1 to 9. According to the embodiments of the present disclosure, the inorganic film having the nanowire structure is formed on the thin film encapsulation layer covered with the OLED device. Due to the characteristics of the nanowire structure, it is very difficult for the moisture to pass therethrough, i.e., the inorganic film having the nanowire structure is hydrophobic, so as to effectively improve the moisture resistance of the encapsulation structure. As a result, in the case that the inorganic film having the nanowire structure is used for encapsulating the OLED device, it is able to prolong a service life of the OLED device, and improve the reliability of the OLED device during the preservation and use thereof.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An encapsulation structure, comprising:
   a flexible substrate;
   an organic light-emitting diode (OLED) device arranged on the flexible substrate;
   a thin film encapsulation layer covering the OLED device, and including a first inorganic film and an organic polymer film arranged alternately; and
   a second inorganic film having a nanowire structure and covering the thin film encapsulation layer.

2. The encapsulation structure according to claim 1, wherein the second inorganic film has a thickness of 100 to 200 nm, and a nanowire of the second inorganic film has a diameter of 50 to 200 nm.

3. The encapsulation structure according to claim 1, further comprising a barrier layer covering the second inorganic film.

4. The encapsulation structure according to claim 1, wherein the second inorganic film is made of a material selected from the group consisting of $Al_2O_3$, $TiO_2$, ZnO, $ZrO_2$, MgO, $HfO_2$, $Ta_2O_5$, $Si_3N_4$, AlN, SiNx, SiON, SiO, $SiO_2$, SiOx, SiC and ITO.

5. A flexible display device, comprising the encapsulation structure according to claim 1.

6. The flexible display device according to claim 5, wherein the second inorganic film has a thickness of 100 to 200 nm, and a nanowire of the second inorganic film has a diameter of 50 to 200 nm.

7. The flexible display device according to claim 5, wherein the encapsulation structure further comprises a barrier layer covering the second inorganic film.

8. The flexible display device according to claim 5, wherein the second inorganic film is made of a material selected from the group consisting of $Al_2O_3$, $TiO_2$, ZnO, $ZrO_2$, MgO, $HfO_2$, $Ta_2O_5$, $Si_3N_4$, AlN, SiNx, SiON, SiO, $SiO_2$, SiOx, SiC and ITO.

9. A method for encapsulating an organic light-emitting diode (OLED) device, comprising steps of:
providing a first hard substrate, and forming a flexible substrate on the first hard substrate;
forming the OLED device on the flexible substrate;
forming a thin film encapsulation layer covering the OLED device and consisting of a first inorganic film and an organic polymer film arranged alternately; and
forming a second inorganic film covering the thin film encapsulation layer and having a nanowire structure.

10. The method according to claim 9, wherein the step of forming the second inorganic film covering the thin film encapsulation layer and having the nanowire structure comprises depositing an inorganic layer onto the thin film encapsulation layer with a metal mask having a nanopore structure, so as to form the second inorganic film.

11. The method according to claim 10, wherein the metal mask having the nanopore structure includes a plurality of nanopores, a distance between the adjacent nanopores is 20 to 30 nm, an inner diameter of each nanopore is 50 to 200 nm, and each nanopore has a length of 100 to 200 nm.

12. The method according to claim 10, wherein the second inorganic film is made of SiNx.

13. The method according to claim 10, wherein the metal mask having the nanopore structure is in direct contact with the thin film encapsulation layer, or separated from the thin film encapsulation layer at an interval.

14. The method according to claim 9, wherein the step of forming the second inorganic film covering the thin film encapsulation layer and having the nanowire structure comprises depositing an inorganic material having a self-assembly growth characteristic onto the thin film encapsulation layer by chemical vapor deposition, so as to form the second inorganic film.

15. The method according to claim 14, wherein the inorganic material having the self-assembly growth characteristic is ZnO.

16. The method according to claim 9, further comprising:
providing a second hard substrate and forming a thermal-failure adhesive layer on the second hard substrate; and
forming a barrier layer on the thermal-failure adhesive layer,
wherein, subsequent to the step of forming the second inorganic film covering the thin film encapsulation layer and having the nanowire, the method further comprises aligning the first hard substrate with the second inorganic film to the second hard substrate with the barrier layer, and heating the thermal-failure adhesive layer to remove the second hard substrate.

\* \* \* \* \*